United States Patent [19]

Cohen

[11] Patent Number: 5,599,585
[45] Date of Patent: Feb. 4, 1997

[54] PROCESS TO MAKE AN ELASTOMERIC METALLIZED FABRIC

[75] Inventor: Bernard Cohen, Berkley Lake, Ga.

[73] Assignee: Kimberly-Clark Corporation, Neenah, Wis.

[21] Appl. No.: 450,599

[22] Filed: May 25, 1995

Related U.S. Application Data

[62] Division of Ser. No. 849,854, Mar. 12, 1992, abandoned.

[51] Int. Cl.[6] ............................... C23C 16/00
[52] U.S. Cl. .................... 427/250; 427/171; 427/176; 427/251; 427/307; 427/299
[58] Field of Search ................. 427/176, 251, 427/299, 307, 171, 250

[56] References Cited

U.S. PATENT DOCUMENTS

| | | | |
|---|---|---|---|
| 3,778,331 | 12/1973 | Scharf | 161/67 |
| 4,013,539 | 3/1977 | Kuehnle | 204/298 |
| 4,032,681 | 6/1977 | Jonnes . | |
| 4,101,698 | 7/1978 | Dunning et al. | 428/31 |
| 4,204,942 | 5/1980 | Chahroudi | 204/298 |
| 4,320,403 | 3/1982 | Ebneth et al. | 343/756 |
| 4,366,202 | 12/1982 | Borovsky | 428/283 |
| 4,437,762 | 3/1984 | Ebneth et al. . | |
| 4,508,776 | 4/1985 | Smith . | |
| 4,656,081 | 4/1987 | Ando et al. | 428/233 |
| 4,657,807 | 4/1987 | Fuerstman . | |
| 4,715,235 | 12/1987 | Fukui et al. . | |
| 4,738,894 | 4/1988 | Borde | 428/283 |
| 4,765,323 | 8/1988 | Poettgen | 128/132 |
| 4,787,699 | 11/1988 | Moulin | 350/96.21 |
| 4,889,135 | 12/1989 | Poettgen | 128/849 |
| 4,913,978 | 4/1990 | Klotz et al. . | |
| 4,933,129 | 6/1990 | Huykman | 264/116 |
| 4,965,122 | 10/1990 | Morman | 428/225 |
| 4,981,747 | 1/1991 | Morman | 428/198 |
| 4,999,222 | 3/1991 | Jones et al. | 427/250 |
| 5,055,338 | 10/1991 | Sheth et al. | 428/155 |
| 5,057,351 | 10/1991 | Jones et al. | 428/138 |
| 5,069,227 | 12/1991 | Maronian | 128/844 |
| 5,076,199 | 12/1991 | Kistrup | 118/52 |
| 5,113,874 | 5/1992 | Maronian | 128/844 |
| 5,114,781 | 5/1992 | Morman | 428/198 |
| 5,116,662 | 5/1992 | Morman | 428/198 |
| 5,122,412 | 6/1992 | Jones et al. . | |
| 5,169,702 | 12/1992 | Schell . | |

FOREIGN PATENT DOCUMENTS

| | | |
|---|---|---|
| 0037235 | 10/1981 | European Pat. Off. . |
| 0076414 | 4/1983 | European Pat. Off. . |
| 0109167 | 5/1984 | European Pat. Off. . |
| 185480 | 6/1986 | European Pat. Off. . |

(List continued on next page.)

OTHER PUBLICATIONS

Mencrieff, R. W., *Man–Made Fibers*, John Wiley & Sons, N.Y., 1966 (pp. 396–403).

"Plasma–and Corona–Modified Polymer Surfaces", *Metallization of Polymers*, ACS Symposium Series 440, 1990, Chapter 5.

"Reactions of Metal Atoms with Monomers and Polymers", *Metallization of Polymers*, ACS Symposium Series 440, 1990, Chapter 18.

(List continued on next page.)

Primary Examiner—Christopher Raimund
Attorney, Agent, or Firm—Karl V. Sidor

[57] ABSTRACT

Disclosed is a process of making an elastomeric metallized fabric composed of an elastomeric fabric and a metallic coating substantially covering at least a portion of at least one side of the fabric. The elastomeric fabric may be an elastomeric knit fabric, an elastomeric woven fabric, an elastomeric nonwoven fibrous web, or laminates of one or more of the same. The elastomeric metallized fabric has a metallic coating with a thickness ranging from about 1 nanometer to about 5 microns and which remains on the fabric when the fabric is stretched at least about 25 percent. The elastomeric metallized fabric may be joined with other materials to form multi-layer laminates.

10 Claims, 9 Drawing Sheets

FOREIGN PATENT DOCUMENTS

| | | |
|---|---|---|
| 0239080 | 9/1987 | European Pat. Off. . |
| 264771 | 4/1988 | European Pat. Off. . |
| 0365692 | 5/1990 | European Pat. Off. . |
| 0185480 | 6/1990 | European Pat. Off. . |
| 0392082 | 10/1990 | European Pat. Off. . |
| 2345295 | 11/1977 | France . |
| 3925232 | 4/1990 | Germany . |
| 61-132652 | 6/1986 | Japan . |
| 61-146869 | 7/1986 | Japan . |
| 61-146870 | 7/1986 | Japan . |
| 62-170581 | 7/1987 | Japan . |
| 63-024196 | 2/1988 | Japan . |
| 63-295762 | 2/1988 | Japan . |
| 1073077 | 3/1989 | Japan . |
| 1171300 | 7/1989 | Japan . |
| 1199771 | 8/1989 | Japan . |
| 2101191 | 4/1990 | Japan . |
| 2118173 | 5/1990 | Japan . |
| 2235626 | 9/1990 | Japan . |
| 2274869 | 11/1990 | Japan . |
| 3011504 | 1/1991 | Japan . |
| 3019300 | 1/1991 | Japan . |
| 96401 | 2/1989 | Romania . |
| 9004662 | 5/1990 | WIPO . |

OTHER PUBLICATIONS

"Plastics Finishing and Decoration", written by Stats (1986), p. 340.

Japanese Abstract, vol. 9, No. 5 (C–260)(1728) 10 Jan. 1985 & JP–A–59 157 275 (Seikoo Kasei KK) 6 Sep. 1984 (Abstract).

Japanese Abstract, vol. 13, No. 24 (C–561) (3372) 19 Jan. 1989 & JP–A–63 227 761 (Hitachi Cable Ltd.) 22 Sep. 1988 (Abstract).

PROCESS TO MAKE AN ELASTOMERIC METALLIZED FABRIC

This application is a divisional of application Ser. No. 07/849,854 entitled "AN ELASTOMERIC METALLIZED FABRIC AND PROCESS TO MAKE THE SAME" and filed in the U.S. Patent and Trademark Office on Mar. 12, 1992 now abandoned.

FIELD OF THE INVENTION

This invention relates to metallized fabrics and a process to prepare metallized fabrics.

BACKGROUND OF THE INVENTION

Metallic coatings ranging in thickness from less than a nanometer up to several microns have been added to sheet materials to provide a decorative appearance and/or various physical characteristics such as, for example, conductivity, static charge resistance, chemical resistance, thermal reflectivity or emissivity, and optical reflectivity. In some situations, metallized sheet materials can be applied to or incorporated in some or all portions of a product instead of metallizing the product itself. This may be especially desirable for products that are, for example, large, temperature sensitive, vacuum sensitive, difficult to handle in a metallizing process, or have complex topographies.

In the past, such use of metallized sheet materials may have been restricted by the limitations of the substrate sheet. In the past, metallic coatings have typically been applied to sheet-like substrates that are considered to be relatively stretch-resistant and inelastic so that the substrate would not deform and cause the metallic coating to detach or flake off. Accordingly, such metallized materials may possess inadequate flexibility, elasticity, softness and/or drape properties for many applications. For example, U.S. Pat. Nos. 4,999,222 and 5,057,351 describe metallized polyethylene plexifilamentary film-fibril sheets that are inelastic and have relatively poor drape and softness which may make them unsuited for applications where elasticity, drape and softness are required. European Patent Publication 392,082-A2 describes a method of manufacturing a metallic porous sheet suitable for use as an electrode plate of a battery. According to that publication, metal may be deposited on a porous sheet (foam sheet, nonwoven web, mesh fabric or combinations of the same) utilizing processes such as vacuum evaporation, electrolytic plating and electroless plating.

Thus, a need exists for an elastomeric metallized sheet material which has desirable flexibility, elasticity, drape, and softness. There is a further need for an elastomeric metallized sheet material which has the desired properties described above and which is so inexpensive that it can be discarded after only a single use. Although metallic coatings have been added to inexpensive sheet materials, such inexpensive metallized sheet materials have generally had limited application because of the poor flexibility, elasticity, drape and softness of the original sheet material.

DEFINITIONS

The terms "elastic" and "elastomeric" are used herein to mean any material which, upon application of a biasing force, is stretchable, that is, elongatable, to a stretched, biased length which is at least about 125 percent of its relaxed unbiased length, and which, will recover at least 40 percent of its elongation upon release of the stretching, elongating force. A hypothetical example would be a one (1) inch sample of a material which is elongatable to at least 1.25 inches and which, upon being elongated to 1.25 inches and released, will recover to a length of not more than 1.10 inches. Many elastic materials may be elongated by much more than 25 percent (i.e., much more than 125 percent of their relaxed length), for example, elongated 200 percent or more, and many of these will recover to substantially their initial relaxed length, for example, to within 105 percent of their initial relaxed length, upon release of the stretching force.

As used herein, the term "nonelastic" refers to any material which does not fall within the definition of "elastic," above.

As used herein, the terms "recover" and "recovery" refer to a contraction of a stretched material upon termination of a biasing force following stretching of the material by application of the biasing force. For example, if a material having a relaxed, unbiased length of one (1) inch is elongated 50 percent by stretching to a length of one and one half (1.5) inches, the material would be elongated 50 percent (0.5 inch) and would have a stretched length that is 150 percent of its relaxed length. If this exemplary stretched material contracted, that is recovered to a length of one and one tenth (1.1) inches after release of the biasing and stretching force, the material would have recovered 80 percent (0.4 inch) of its one-half (0.5) inch elongation. Recovery may be expressed as [(maximum stretch length—final sample length)/(maximum stretch length—initial sample length)]× 100.

As used herein, the term "elastomeric fabric" refers to a fabric which can be a woven textile fabric, knit textile fabric or nonwoven fabric or web and which includes a sufficient amount of elastomeric fibers, filaments, threads, strands and/or binders (i.e., fibers, filaments, threads, strands and/or binders which are made of an elastomeric material and which have stretch and recovery properties) so that the fabric itself is "elastic" as defined above.

As used herein, the term "nonwoven web" means a web having a structure of individual fibers or threads which are interlaid, but not in an identifiable, repeating manner. Nonwoven webs have been, in the past, formed by a variety of processes such as, for example, meltblowing processes, spunbonding processes and bonded carded web processes.

As used herein, the term "meltblown fibers" means fibers formed by extruding a molten thermoplastic material through a plurality of fine, usually circular, die capillaries as molten threads or filaments into a high-velocity gas (e.g. air) stream which attenuates the filaments of molten thermoplastic material to reduce their diameters, which may be to microfiber diameter. Thereafter, the meltblown fibers are carried by the high-velocity as stream and are deposited on a collecting surface to form a web of randomly disbursed meltblown fibers. The meltblown process is described in various patents and publications, including NRL Report 4364, "Manufacture of Super-Fine Organic Fibers" by V. A. Wendt, E. L. Boone, and C. D. Fluharty; NRL Report 5265, "An Improved device for the Formation of Super-Fine Thermoplastic Fibers" by K. D. Lawrence, R. T. Lukas, and J. A. Young; and U.S. Pat. No. 3,849,241, issued Nov. 19, 1974, to Buntin, et al.

As used herein, the term "microfibers" means small diameter fibers having an average diameter not greater than about 100 microns, for example, having an average diameter of from about 0.1 microns to about 50 microns, or more particularly, microfibers may have an average diameter of from about 0.5 microns to about 40 microns, or even more particularly, microfibers may have an average diameter of from about 1 micron to about 30 microns.

As used herein, the term "spunbonded web" refers to web of small diameter fibers and/or filaments which are formed by extruding a molten thermoplastic material as filaments from a plurality of fine, usually circular, capillaries in a spinnerette which the diameter of the extruded filaments then being rapidly reduced, for example, by non-eductive or eductive fluid-drawing or other well known spunbonding mechanisms. The production of spunbonded nonwoven webs is illustrated in patents such as Appel, et al., U.S. Pat. No. 4,340,563; Dorschner et al., U.S. Pat. No. 3,692,618; Kinney, U.S. Pat. Nos. 3,338,992 and 3,341,394; Levy, U.S. Pat. No. 3,276,944; Peterson, U.S. Pat. No. 3,502,538; Hartman, U.S. Pat. No. 3,502,763; Dobo et al., U.S. Pat. No. 3,542,615; and Harmon, Canadian Patent No. 803,714.

The term "machine direction" as used herein refers to the direction of travel of the forming surface onto which fibers are deposited during formation of a nonwoven web.

The term "cross-machine direction" as used herein refers to the direction which is perpendicular to the machine direction defined above.

As used herein, the term "disposable" is not limited to single use or limited use articles but also refers to articles that are so inexpensive to the consumer that they can be discarded if they become soiled or otherwise unusable after only one or a few uses.

As used herein, the term "polymer" generally includes, but is not limited to, homopolymers, copolymers, such as, for example, block, graft, random and alternating copolymers, terpolymers, etc. and blends and modifications thereof. Furthermore, unless otherwise specifically limited, the term "polymer" shall include all possible geometrical configurations of the material. These configurations include, but are not limited to, isotactic, syndiotactic and random symmetries.

As used herein, the term "consisting essentially of" does not exclude the presence of additional materials which do not significantly affect the desired characteristics of a given composition or product. Exemplary materials of this sort would include, without limitation, pigments, surfactants, waxes, flow promoters, particulates and materials added to enhance processability of the composition.

SUMMARY OF THE INVENTION

The present invention addresses the above-described problems by providing an elastomeric metallized fabric composed of an elastomeric fabric and a metallic coating covering substantially at least a portion of at least one side of the elastomeric fabric.

According to one aspect of the present invention, the elastomeric fabric component of the elastomeric metallized fabric may be an elastomeric nonwoven fibrous web such as, for example, a web of meltblown fibers, a bonded-carded web, or a spun-bonded web. The elastomeric fabric may also be an elastomeric knitted or an elastomeric woven fabric containing elastomeric threads, yarns and/or filaments. In one aspect of the present invention, the elastomeric fabric may be a laminate of two or more elastomeric fabrics. It is contemplated that embodiments of the elastomeric metallized fabric of the present invention may be manufactured so inexpensively that it may be economical to dispose of the materials after a limited period of use.

According to the present invention, the elastomeric fabric may have a basis weight ranging from about 5 to about 170 grams per square meter. For example, the elastomeric fabric may have a basis weight ranging from about 30 to about 100 grams per square meter. More particularly, the elastomeric fabric may have a basis weight ranging from about 35 to about 70 grams per square meter.

When the elastomeric fabric is an elastomeric nonwoven fibrous web, it may be a nonwoven web of fibers and/or filaments formed from an elastomeric polymer such as, for example, elastomeric polyesters, elastomeric polyurethanes, elastomeric polyamides, elastomeric copolymers of ethylene and at least one vinyl monomer, and elastomeric A—B—A' block copolymers wherein A and A' are the same or different thermoplastic polymer, and wherein B is an elastomeric polymer block. The elastomeric polymer may be blended with a processing aid such as, for example, a polyolefin. Alternatively and/or additionally, the elastomeric polymer may be blended with a tackifying resin.

The elastomeric fibers may be mixed with one or more other materials such as, for example, wood pulp, non-elastomeric fibers, and particulates. Exemplary non-elastomeric fibers include polyester fibers, polyamide fibers, glass fibers, polyolefin fibers, cellulosic derived fibers, multi-component fibers, natural fibers, absorbent fibers, electrically conductive fibers or blends of two or more of such fibers. Exemplary particulates include activated charcoal, clays, starches, metal oxides, super-absorbent materials and mixtures of such materials.

Generally speaking, the metallic coating on the elastomeric fabric may range from about 1 nanometer to about 5 microns. For example, the metallic coating may range from about 5 nanometers to about 1 micron. More particularly, the metallic coating may range from about 10 nanometers to about 500 nanometers.

In one aspect of the present invention, the elastomeric metallized fabric is adapted to retain substantially all of its metallic coating when stretched at least about 25 percent. That is, there is little or no flaking or loss of metal observable to the unaided eye or conventional lint test procedures when an elastomeric metallized fabric of the present invention covered with at least at low to moderate levels of metallic coating is subjected to normal handling. For example, the elastomeric metallized fabric may be adapted to retain substantially all of its metallic coating when stretched 35 percent or more. More particularly, the elastomeric metallized fabric may be adapted to retain substantially all of its metallic coating when stretched 100 percent or more.

The metallic coating may cover substantially all of one or both sides of the elastomeric fabric or the metallic coating may be limited to portions of one or both sides of the elastomeric fabric. For example, the elastomeric fabric may be masked during the metal coating process to produce discrete portions of metallized elastomeric fabric. One or more layers of the same or different metals may be coated onto the elastomeric fabric. The coating may be any metal or metallic alloy which can be deposited onto an elastomeric fabric and which bonds to the fabric to form a durable coating. Exemplary metals include aluminum, copper, tin, zinc, lead, nickel, iron, gold, silver and the like. Exemplary metallic alloys include copper-based alloys, aluminum based alloys, titanium based alloys, and iron based alloys. Conventional fabric finishes may be applied to the elastomeric metallized fabric. For example, lacquers or sealants may be applied to the elastomeric metallized fabric.

The present invention encompasses multilayer materials which contain at least one layer which is an elastomeric metallized fabric. For example, an elastomeric metallized nonwoven web of meltblown fibers may be laminated with one or more webs of spunbonded filaments. The elastomeric metallized fabric may even be sandwiched between other layers of materials.

According to the present invention, an elastomeric metallized fabric may be made by a process which includes the following steps: (1) providing an elastomeric fabric; and (2) metallizing at least one side of the elastomeric fabric so that at least a portion of the elastomeric fabric is substantially covered with a metallic coating.

The metallizing of the elastomeric fabric may be accomplished by any process which can be used to deposit metal onto a fabric and which bonds the metal to the fabric. The metallizing step may be carried out by techniques such as metal vapor deposition, metal sputtering, plasma treatments, electron beam treatments. alternatively and/or additionally, the fibers may be covered with certain compounds which can be chemically reacted (e.g., via a reduction reaction) to produce a metallic coating. Before the metallic coating is added to the elastomeric fabric the surface of the fabric may be modified utilizing techniques such as, for example, plasma discharge or corona discharge treatments. According to one embodiment of the process of the present invention, the elastomeric fabric may be elongated during the metallizing step. For example, the elastomeric fabric may be elongated by 10 percent or more. More particularly, the elastomeric fabric may be elongated to about its elastic limit (e.g., 300 percent or more). If the elastic fabric is an elastomeric nonwoven web, for example, an elastomeric nonwoven web of meltblown fibers, the web may be calendered or bonded either before or after the metallizing step.

DETAILED DESCRIPTION OF THE INVENTION

Figure 1:
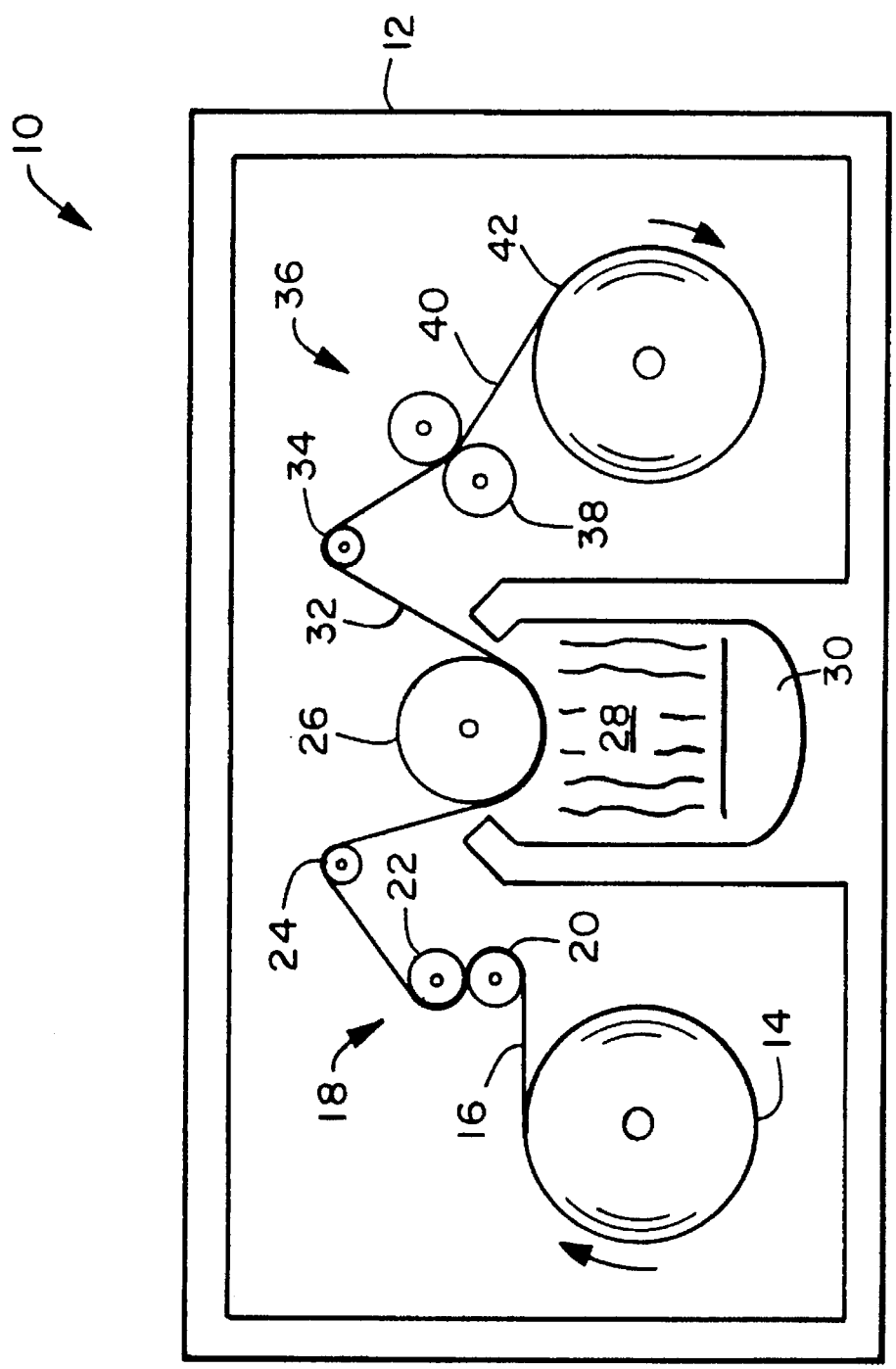
FIG. 1 is an illustration of an exemplary process for making an elastomeric metallized fabric.

Referring to the drawings and in particular to FIG. 1, there is shown at 10 an exemplary process of making the elastomeric metallized fabric of the present invention within an evacuated chamber 12. Metal vapor deposition typically takes place in the evacuated chamber 12 at an absolute pressure from about $10^{-6}$ to about $10^{-4}$ millimeters Hg (mercury). A supply roll 14 of an elastomeric fabric 16 located within the evacuated chamber 12 is unwound. The elastomeric fabric 16 travels in the direction indicated by the arrow associated therewith as the supply roll 14 rotates in the direction of the arrow associated therewith. The elastomeric fabric 16 passes through a nip of an S-roll arrangement 18 formed by two stack rollers 20 and 22. It is contemplated that the elastomeric fabric may be formed by fabric forming processes such as, for example, meltblowing processes or spunbonding processes and passed directly through the nip of the S-roll arrangement 18 without first being stored on a supply roll.

From the reverse S path of the S-roll arrangement 18, the elastomeric fabric 16 passes over an idler roller 24 and then contacts a portion of a chill roll 26 while it is exposed to metal vapor 28 emanating from a molten metal bath 30. Metal vapor condenses on the elastomeric fabric 16 forming an elastomeric metallized fabric 32. Although a chill roll 26 is not required to practice the present invention, it has been found to be useful in some situations to avoid deterioration of the elastomeric fabric 16 during exposure to the metal vapor 28. For example, a chill roll would be desirable when the elastomeric fabric is exposed to the metal vapor for a relatively long period. Multiple metal baths and chill roll arrangements (not shown) may be used in series to apply multiple coatings of the same or different metals. Additionally, the present invention is meant to encompass other types of metallizing processes such as, for example, metal sputtering, electron beam metal vapor deposition and the like. Metal may also be deposited on the elastomeric fabric by means of a chemical reaction such as, for example, a chemical reduction reaction. Generally speaking, any process which deposits metal on the elastomeric fabric with minimal deterioration of the fabric may be employed. The metallizing processes described above may be used in combination in the practice of the present invention.

The metallic coating substantially covers at least a portion of at least one side of the elastomeric fabric 16. For example, the metallic coating may substantially cover all of one or both sides of the elastomeric fabric 16. The elastomeric fabric 16 may be masked with one or more patterns during exposure to the metal vapor 28 so that only desired portions of one or both sides of the elastomeric fabric have a metallic coating.

The elastomeric metallized fabric 32 passes over an idler roller 34 and through nip of a drive roller arrangement 36 formed by two drive rollers 38 and 40. Because of the peripheral linear speed of the rollers of the S-roll arrangement 18 is controlled to be less than the peripheral linear speed of the rollers of the drive roller arrangement 36, the elastomeric fabric 16 is tensioned between the S-roll arrangement 18 and the drive roller arrangement 36. By adjusting the difference in the speeds of the rollers, the elastomeric fabric 16 is tensioned so that it stretches the desired amount and is maintained in such stretched condition as it travels over a portion of the chill roll 26 during exposure to the metal vapor 28. Generally speaking, the elastomeric fabric 16 may be stretched to any elongation within its elastic limit and maintained in such stretched condition during exposure to the metal vapor 28. For example, a nonwoven web of meltblown fibers available from the Kimberly-Clark Corporation under the trade designation DEMIQUE® (basis weight about 51 grams per square meter) may be stretched from about 10 percent up to about 500 percent or more. More particularly, the DEMIQUE® fabric may be stretched from about 25 percent to 200 percent. Of course, it is not necessary for the elastomeric fabric 16 to be stretched at all during the metallizing process in order to make an elastomeric metallized fabric.

If desired, the elastomeric fabric 16 may be stretched to a first elongation of, for example, 20 percent, and exposed to metal vapor 28 to deposit a metallic coating on the elastomeric fabric 16. The fabric may then be stretched to a different elongation, for example, 50 percent, and exposed to metal vapor from the same or a different molten metal bath) to deposit a second metallic coating. This step may be repeated any number of times with different combinations of elongations and molten metal baths to produce elastomeric metallized fabrics having many different variations of metallic coatings.

The elastomeric metallized fabric 32 immediately relaxes upon release of the tensioning force provided by S-roll arrangement 18 and the bonder roll arrangement 36, and then the elastomeric metallized fabric 32 is wound up on a winder 42.

Conventional fabric post-treatments may be applied to the elastomeric metallized fabric provided they do not harm the metallic coating. For example, shellacs or sizing may be applied.

Generally speaking, the elastomeric fabric may be any elastomeric nonwoven fibrous web, elastomeric knitted fabric or elastomeric woven fabric which can survive the metallizing process and provide an elastomeric metallized fabric having good stretch and recovery properties. Exemplary elastomeric knitted fabrics are knitted fabrics made utilizing elastomeric threads or yarns to provide stretch and recovery properties in at least one direction. Exemplary elastomeric woven fabrics are fabrics having elastomeric warp and/or weft threads or yarns that provide stretch and recovery properties in at least one direction. Conventional elastomeric threads which may be used in the woven or knit materials that contain elastomeric threads, yarns and/or fibers such as, for example, spandex fibers.

Desirably, the elastomeric fabric component of the elastomeric metallized fabric is an elastomeric nonwoven fibrous web. For example, the elastomeric nonwoven web may be an elastomeric nonwoven bonded carded web, an elastomeric nonwoven web of spunbonded filaments or an elastomeric nonwoven web of meltblown fibers.

Generally, any suitable elastomeric fiber forming resins or blends containing the same may be utilized to form the nonwoven webs of elastomeric fibers of the invention. For example, useful elastomeric fiber forming resins include block copolymers having the general formula A—B—A' or A—B, where A and A' are each a thermoplastic polymer endblock which contains a styrenic moiety such as a poly (vinyl arene) and where B is an elastomeric polymer midblock such as a conjugated diene or a lower alkene polymer. Block copolymers of the A—B—A' type can have different or the same thermoplastic block polymers for the A and A' blocks, and the present block copolymers are intended to embrace linear, branched and radial block copolymers. In this regard, the radial block copolymers may be designated $(A-B)_m-X$, wherein X is a polyfunctional atom or molecule and in which each $(A-B)_m$—radiates from X in a way that A is an endblock. In the radial block copolymer, X may be an organic or inorganic polyfunctional atom or molecule and m is an integer having the same value as the functional group originally present in X. It is usually at least 3, and is frequently 4 or 5, but not limited thereto. Thus, in the present invention, the expression "block copolymer", and particularly "A—B—A'" and "A—B" block copolymer, is intended to embrace all block copolymers having such rubbery blocks and thermoplastic blocks as discussed above, which can be extruded (e.g., by meltblowing), and without limitation as to the number of blocks. The elastomeric nonwoven web may be formed from, for example, elastomeric (polystyrene/ poly(ethylene-butylene)/polystyrene) block copolymers available from the Shell Chemical Company of Houston, Texas under the trade designation KRATON G. One such block copolymer may be, for example, KRATON® G-1657.

Other exemplary elastomeric materials which may be used to forman elastomeric nonwoven web include polyurethane elastomeric materials such as, for example, those available under the trademark ESTANE from B. F. Goodrich & Co., polyamide elastomeric materials such as, for example, those available under the trademark PEBAX from the Rilsan Company, and polyester elastomeric materials such as, for example, those available under the trade designation HYTREL® from E. I. DuPont De Nemours & Company. Formation of an elastomeric nonwoven web from polyester elastomeric materials is disclosed in, for example, U.S. Pat. No. 4,741,949 to Morman et al., hereby incorporated by reference. Elastomeric nonwoven webs may also be formed from elastomeric copolymers of ethylene and at least one vinyl monomer such as, for example, vinyl acetates, unsaturated aliphatic monocarboxylic acids, and esters of such monocarboxylic acids. The elastomeric copolymers and formation of elastomeric nonwoven webs from those elastomeric copolymers are disclosed in, for example, U.S. Pat. No. 4,803,117.

Processing aids may be added to the elastomeric polymer. For example, a polyolefin may be blended with the elastomeric polymer (e.g., the A—B—A elastomeric block copolymer) to improve the processability of the composition. The polyolefin must be one which, when so blended and subjected to an appropriate combination of elevated pressure and elevated temperature conditions, is extrudable, in blended form, with the elastomeric polymer. Useful blending polyolefin materials include, for example, polyethylene, polypropylene and polybutene, including ethylene copolymers, propylene copolymers and butene copolymers. A particularly useful polyethylene may be obtained from the U.S.I. Chemical Company under the trade designation Petrothene NA 601 (also referred to herein as PE NA 601 or polyethylene NA 601). Two or more of the polyolefins may be utilized. Extrudable blends of elastomeric polymers and polyolefins are disclosed in, for example, U.S. Pat. No. 4,663,220 to Wisneski et al., hereby incorporated by reference.

The elastomeric nonwoven web may also be a pressure sensitive elastomer adhesive web. For example, the elastomeric material itself may be tacky or, alternatively, a compatible tackifying resin may be added to the extrudable elastomeric compositions described above to provide an elastomeric web that can act as a pressure sensitive adhesive, e.g., to bond the elastomeric web to another material or to enhance bonding of the metallic coating to the web. In regard to the tackifying resins and tackified extrudable elastomeric compositions, note the resins and compositions as disclosed in U.S. Pat. No. 4,787,699, hereby incorporated by reference.

Any tackifier resin can be used which is compatible with the elastomeric polymer and can withstand the high processing (e.g., extrusion) temperatures. The tackifier resins should also be able to withstand conditions encountered while the elastomeric fabric is being metallized. For example, if physical vapor deposition is used, the tackifier resin should be relatively stable during the brief exposure to heat and high vacuum so as not to produce significant amounts of vapor which could interfere with the metallizing process. If the elastomeric polymer (e.g., A—B—A elastomeric block copolymer) is blended with processing aids such as, for example, polyolefins or extending oils, the tackifier resin should also be compatible with those processing aids. Generally, hydrogenated hydrocarbon resins are preferred tackifying resins, because of their better temperature stability. REGALREZ™ and ARKON™ P series tackifiers are examples of hydrogenated hydrocarbon resins. ZONATAK™501 lite is an example of a terpene hydrocarbon. REGALREZ™ hydrocarbon resins are available from Hercules Incorporated. ARKON™ P series resins are available from Arakawa Chemical (U.S.A.) Incorporated. Of course, the present invention is not limited to use of such three tackifying resins, and other tackifying resins which are compatible with the other components of the composition and can withstand the high processing temperatures, can also be used.

The elastomeric fabric may also be a multilayer material in that it may include two or more individual coherent webs and/or films. Additionally, the elastomeric fabric may be a multilayer material in which one or more of the layers contain a mixture of elastomeric and non-elastomeric fibers or particulates. An example of the latter type of elastomeric web, reference is made to U.S. Pat. No. 4,209,563, incorporated herein by reference, in which elastomeric and non-elastomeric fibers are commingled to form a single coherent web of randomly dispersed fibers. Another example of such an elastomeric composite web would be one made by a technique such as disclosed in U.S. Pat. No. 4,741,949 and in U.S. Pat. Nos. 4,100,324 and 4,803,117, the contents of each of which are incorporated herein by reference in their entirety. Those patents disclose elastomeric nonwoven materials which include a mixture of meltblown thermoplastic fibers and other materials. Such mixtures may be formed by adding fibers and/or particulates to the gas stream in which elastomeric meltblown fibers are carried so that an intimate entangled commingling of the elastomeric meltblown fibers and other materials occurs prior to collection of the meltblown fibers upon a collection device to form a coherent web of randomly dispersed meltblown fibers and other materials. Useful materials which may be used in such nonwoven elastomeric composite webs include, for example, wood pulp fibers, staple length fibers from natural and synthetic sources (e.g., cotton, wool, asbestos, rayon, polyester, polyamide, glass, polyolefin, cellulose derivatives and the like), non-elastic meltblown fibers, multi-component fibers, absorbent fibers, electrically conductive fibers, and particulates such as, for example, activated charcoal/carbon, clays, starches, metal oxides, super-absorbent materials and mixtures of such materials. Other types of nonwoven elastomeric composite webs may be used. For example, a hydraulically entangled nonwoven elastomeric composite web may be used such as disclosed in U.S. Pat. Nos. 4,879,170 and 4,939,016 both to Radwanski, et al. the contents of which are incorporated herein by reference in their entirety.

If the elastomeric nonwoven web is a elastomeric nonwoven web of meltblown fibers, the meltblown fibers may range, for example, from about 0.1 to about 100 microns in diameter. However, if barrier properties are important in the finished laminate (for example, if it is important that the final laminate material have increased opacity and/or insulation and/or dirt protection and/or liquid repellency) then finer fibers which may range, for example, from about 0.5 to about 20 microns can be used.

The basis weight of the elastomeric fabric may range from about 5 to about 170 grams per square meter. The basis weight is selected to provide desired properties for the elastomeric metallized fabric, including recovery and barrier properties. Desirably, the basis weight of the elastomeric fabric may range from about 30 to about 100 grams per square meter. Even more particularly, the basis weight of the elastomeric fabric may range from about 35 to about 70 grams per square meter. The extreme thinness of the low basis weight elastomeric nonwoven webs which may be used in certain embodiments of the invention would appear to enhance the materials highly desirable drape and conformability.

The elastomeric fabric may be pre-treated before the metallizing step. For example, the elastomeric fabric may be calendered with a flat roll, point bonded, pattern bonded or even saturated in order to achieve desired physical and/or textural characteristics. It is contemplated that liquid and/or vapor permeability may be modified by flat thermal calendering or pattern bonding some types of elastomeric nonwoven fibrous web. Additionally, at least a portion of the surface of the individual fibers or filaments of the elastomeric fabric may be modified by various known surface modification techniques to alter the adhesion of the metallic coating to the elastomeric fabric. Exemplary surface modification techniques include, for example, chemical etching, chemical oxidation, ion bombardment, plasma treatments, flame treatments, heat treatments, and corona discharge treatments.

One important feature of the present invention is that the elastomeric metallized fabric is adapted to retain substantially all of its metallic coating when stretched at least about 25 percent. That is, there is little or no flaking or loss of metal observable to the unaided eye when an elastomeric metallized fabric of the present invention covered with at least at low to moderate levels of metallic coating is subjected to normal handling. For example, an elastomeric metallized fabric having a metallic coating from about 5 nanometers to about 500 nanometers may be adapted to retain substantially all of its metallic coating when stretched from about 30 percent to more than 100 percent (e.g., 500 percent or more). More particularly, such an elastomeric metallized fabric may be adapted to retain substantially all of its metallic coating when stretched from about 35 percent to about 75 percent. The thickness of the deposited metal depends on several factors including, for example, exposure time, the pressure inside the evacuated chamber, temperature of the molten metal, surface temperature of the fabric, size of the metal vapor "cloud", and the distance between the elastomeric fabric and molten metal bath, the number of passes over through the metal vapor "cloud", and the speed of the moving web. Generally speaking, lower process speeds tend to correlate with heavier or thicker metallic coatings on the fabric but lower speeds increase the exposure time to metal vapor under conditions which may deteriorate the elastomeric fabric. Under some process conditions, exposure times can be less than about 1 second, for example, less than about 0.75 seconds or even less than about 0.5 seconds. Generally speaking, any number of passes through the metal vapor "cloud" may be used to increase the thickness of the metallic coating.

The elastomeric fabric is generally metallized to a metal thickness ranging from about 1 nanometer to about 5 microns. Desirably, the thickness of the metallic coating may range from about 5 nanometers to about 1 micron. More particularly, the thickness of the metallic coating may be from about 10 nanometers to about 500 nanometers.

Any metal which is suitable for physical vapor deposition or metal sputtering processes may be used to form metallic coatings on the elastomeric fabric. Exemplary metals include aluminum, copper, tin, zinc, lead, nickel, iron, gold, silver and the like. Exemplary metallic alloys include copper-based alloys (e.g., bronze, monel, cupro-nickel and aluminum-bronze); aluminum based alloys (aluminum-silicon, aluminum-iron, and their ternary relatives); titanium based alloys; and iron based alloys. Useful metallic alloys include magnetic materials (e.g., nickel-iron and aluminum-nickel-iron) and corrosion and/or abrasion resistant alloys.

FIGS. 2–9 are scanning electron microphotographs of exemplary elastomeric metallized fabrics of the present invention. The elastomeric metallized fabrics shown in FIGS. 2–9 were made from 51 gsm DEMIQUE® elastomeric nonwoven fibrous webs available from the Kimberly-Clark Corporation. A metal coating was added to the webs utilizing conventional techniques. The scanning electron microphotographs were obtained directly from the metal coated DEMIQUE® fabric without the pre-treatment conventionally used in scanning electron microscopy.

Figure 2:
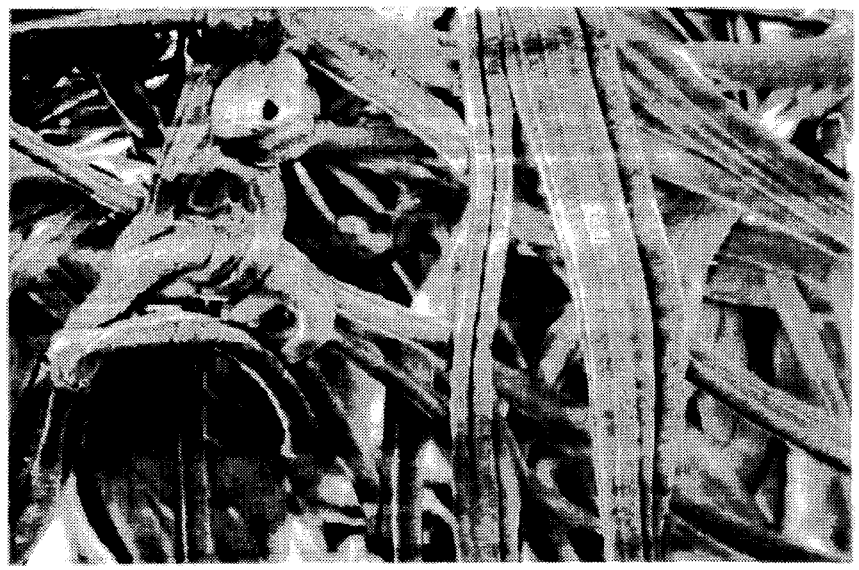
FIG. 2 is a photomicrograph of an exemplary elastomeric metallized fabric.
Figure 3:
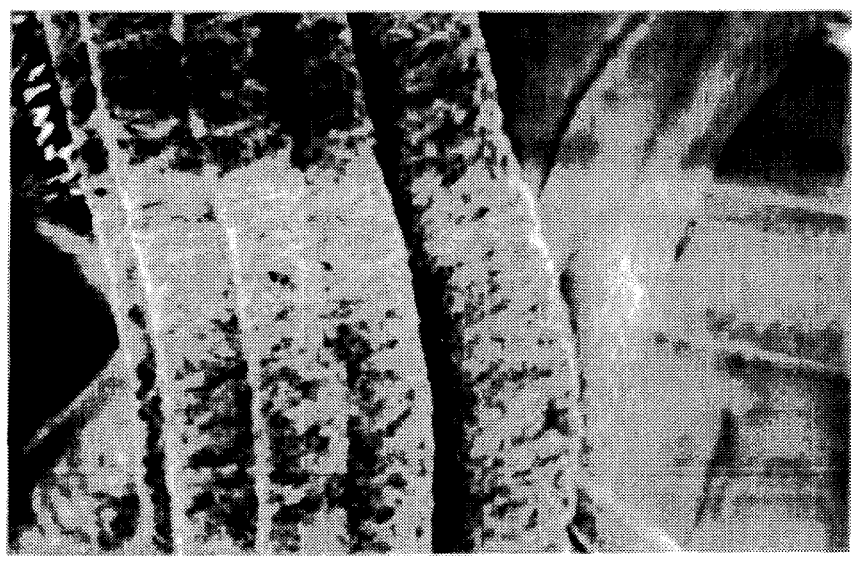
FIG. 3 is an enlarged photomicrograph of a portion of the exemplary elastomeric metallized fabric shown in FIG. 2.

More particularly, FIG. 2 is a 305X microphotograph of a DEMIQUE® elastomeric fibrous web with a metallic aluminum coating. The sample was metallized while it was in the unstretched condition and is shown in the microphotograph in the unstretched condition. FIG. 3 is a 1,260X microphotograph of a portion of the material shown in FIG. 2.

Figure 4:
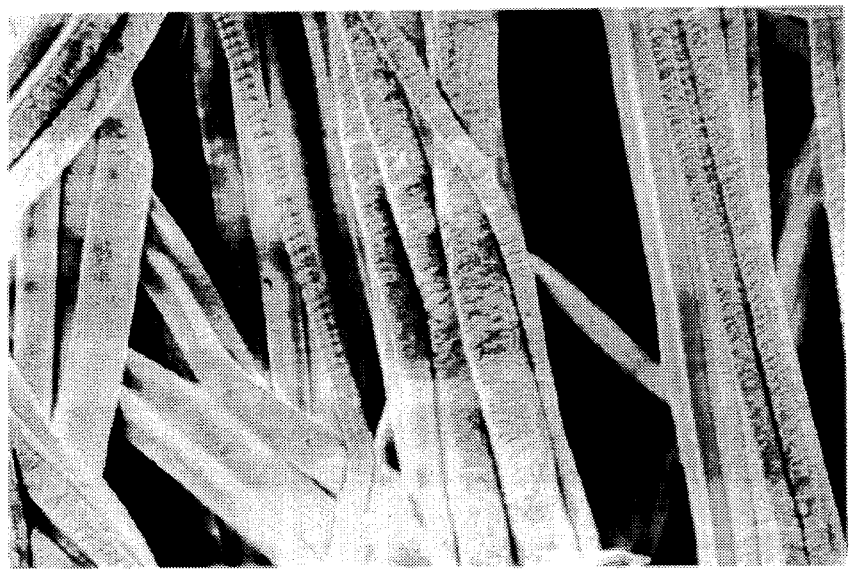
FIG. 4 is a photomicrograph of an exemplary elastomeric metallized fabric.
Figure 5:
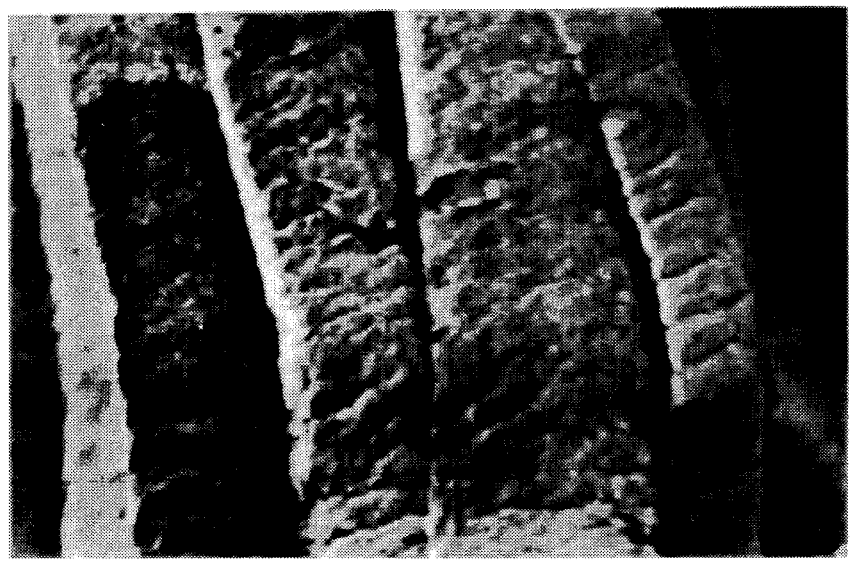
FIG. 5 is an enlarged photomicrograph of a portion of the exemplary elastomeric metallized fabric shown in FIG. 4.

FIG. 4 is a 303X microphotograph of a DEMIQUE® elastomeric nonwoven web having a metallic aluminum coating. The elastomeric nonwoven web was coated while it was in the unstretched condition, and the microphotograph shows the elastomeric metallized web while it is stretched 100 percent. FIG. 5 is a 1250X microphotograph of a portion of the material shown in FIG. 4.

Figure 6:
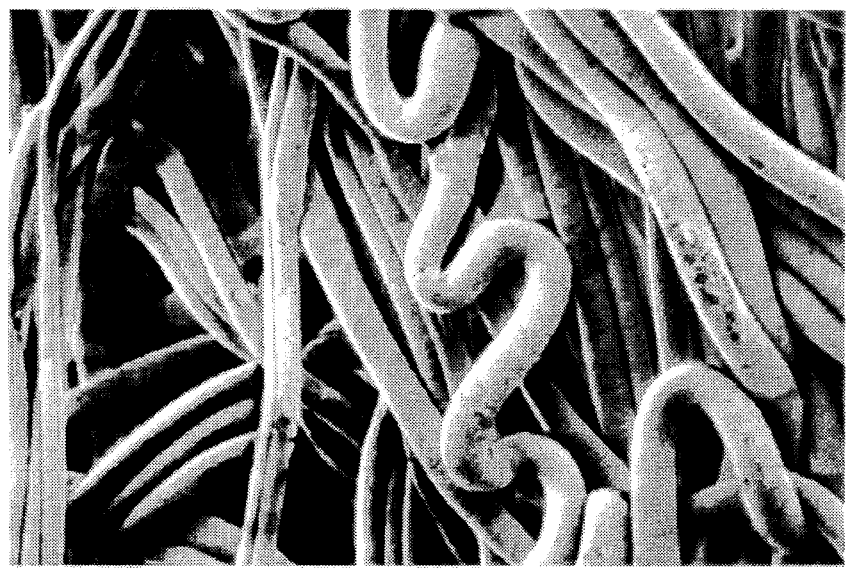
FIG. 6 is a photomicrograph of an exemplary elastomeric metallized fabric.
Figure 7:
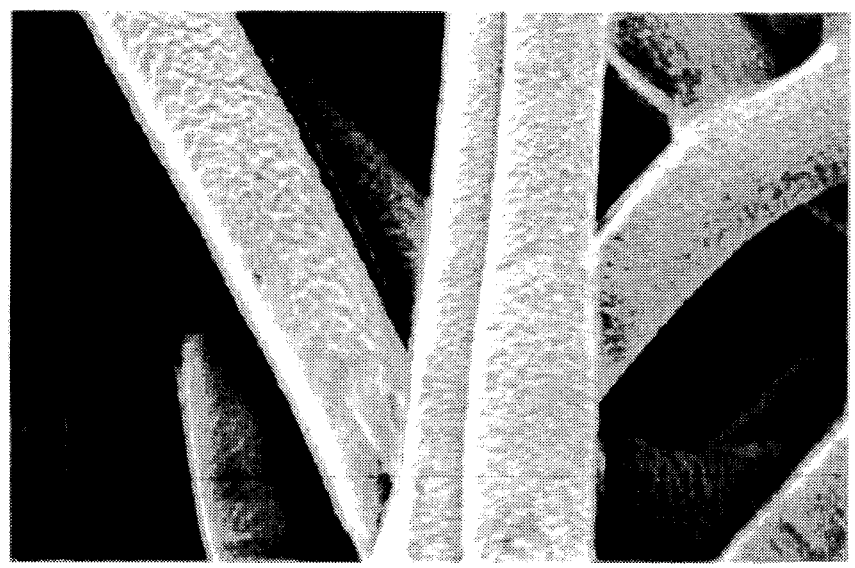
FIG. 7 is an enlarged photomicrograph of a portion of the exemplary elastomeric metallized fabric shown in FIG. 6.

FIG. 6 is a 303X microphotograph of a DEMIQUE® elastomeric nonwoven web with a metallic aluminum coating. This material was coated while it was stretched approximately 100 percent. The microphotograph shows the material in an unstretched condition. FIG. 7 is a 1,230X microphotograph of a portion of the material shown in FIG. 6.

Figure 8:
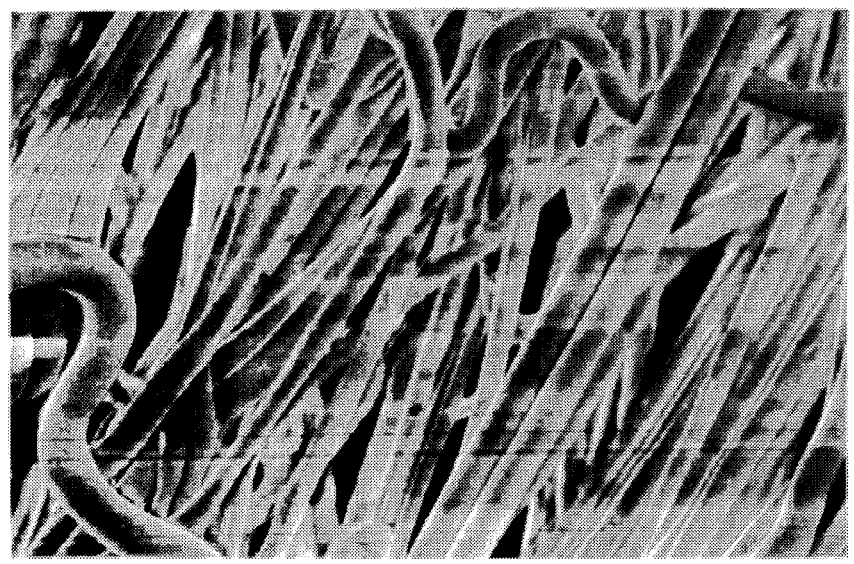
FIG. 8 is a photomicrograph of an exemplary elastomeric metallized fabric.
Figure 9:
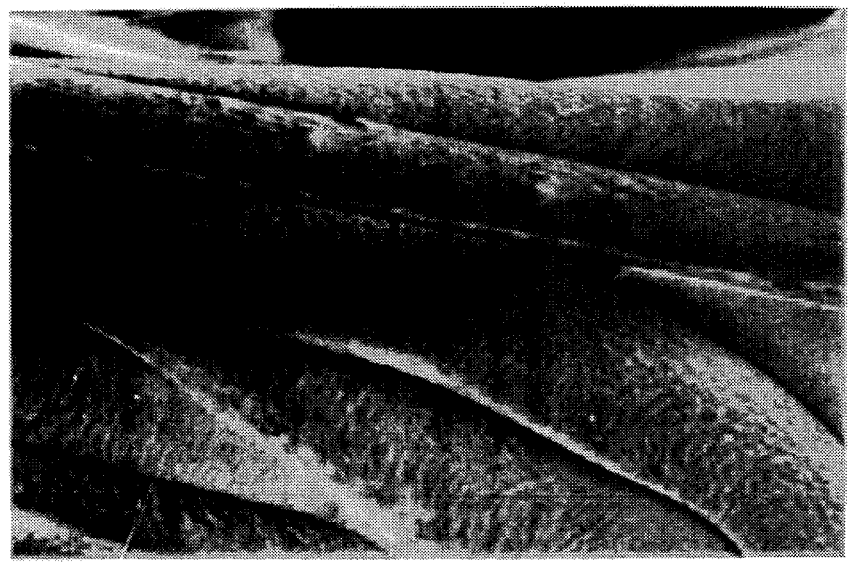
FIG. 9 is an enlarged photomicrograph of a portion of the exemplary elastomeric metallized fabric shown in FIG. 8.

FIG. 8 is a 304X microphotograph of a DEMIQUE® elastomeric nonwoven web with a metallic aluminum coating. This material was coated while it was stretched approximately 100 percent. The microphotograph shows the material as it is held in an elongation of about 100 percent. FIG. 9 is a 1,240X microphotograph of a portion of the material shown in FIG. 8.

Figure 10:
FIG. 10 is a photomicrograph of a cross section of an exemplary elastomeric metallized fabric.
Figure 11:
FIG. 11 is an enlarged photomicrograph of a portion of the exemplary elastomeric metallized fabric shown in FIG. 10.

FIGS. 10–13 are transmission electron microphotographs of exemplary elastomeric metallized fabrics of the present invention. The transmission electron microphotographs were made utilizing a JEOL 1200EX transmission electron microscope operated at 100 kV. Microphotographs were made from ultra thin cross sections of metal coated samples. FIG. 10 is a 8,862.8X transmission electron microphotograph of an aluminum coated elastomeric nonwoven web available from the Kimberly-Clark Corporation under the trade name DEMIQUE®. FIG. 11 is a 16,893X microphotograph of a portion of the material shown in FIG. 10. As can be seen from the cross sections of FIGS. 10 and 11, a continuous surface coating of approximately 10–12 nanometers is visible. The coating appears to be grainless and uniformly dense. There appears to be disrupted areas which may be composed of multiple micro fine layers approximately 0.3 nanometers in thickness.

Figure 12:
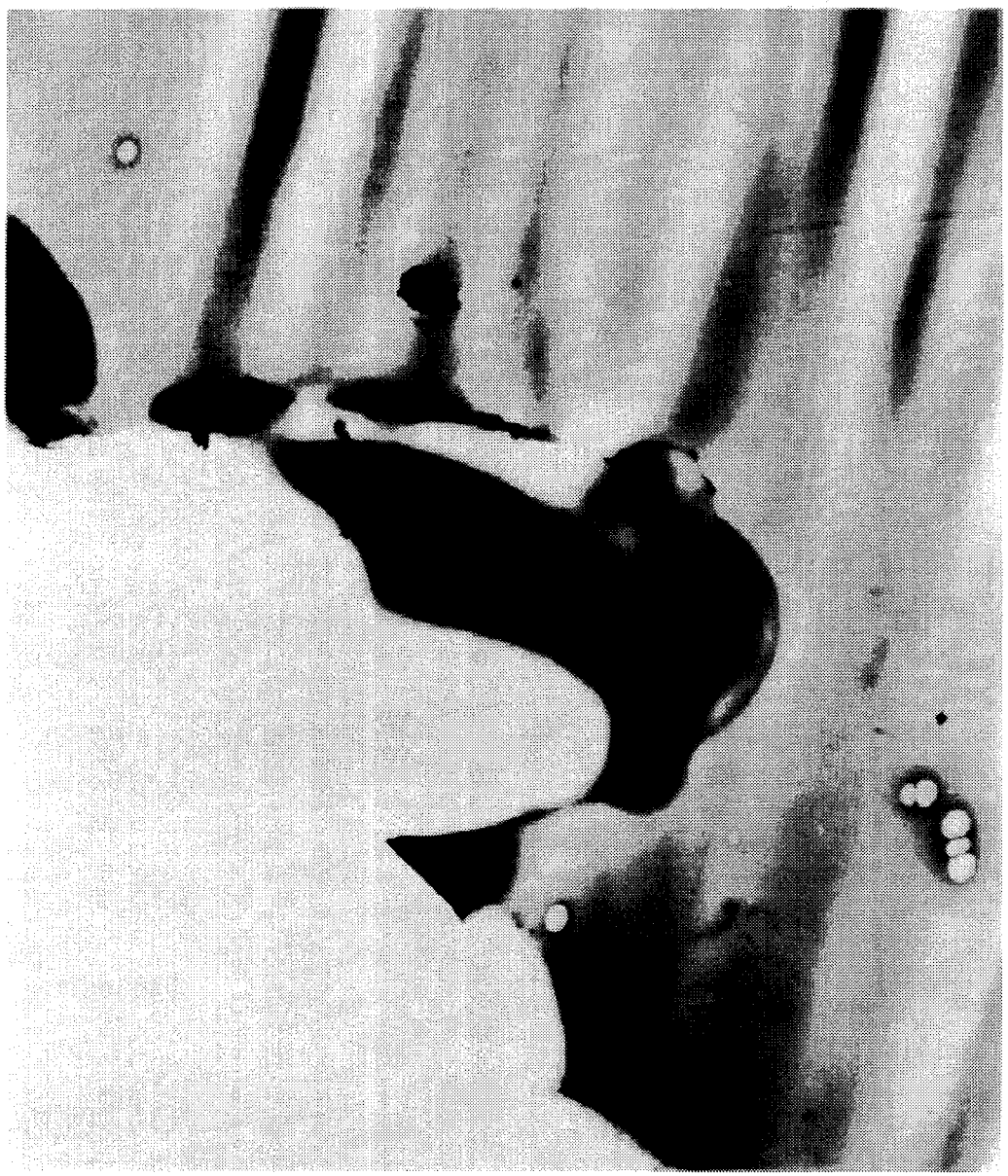
FIG. 12 is a photomicrograph of a cross section of an exemplary elastomeric metallized fabric.
Figure 13:
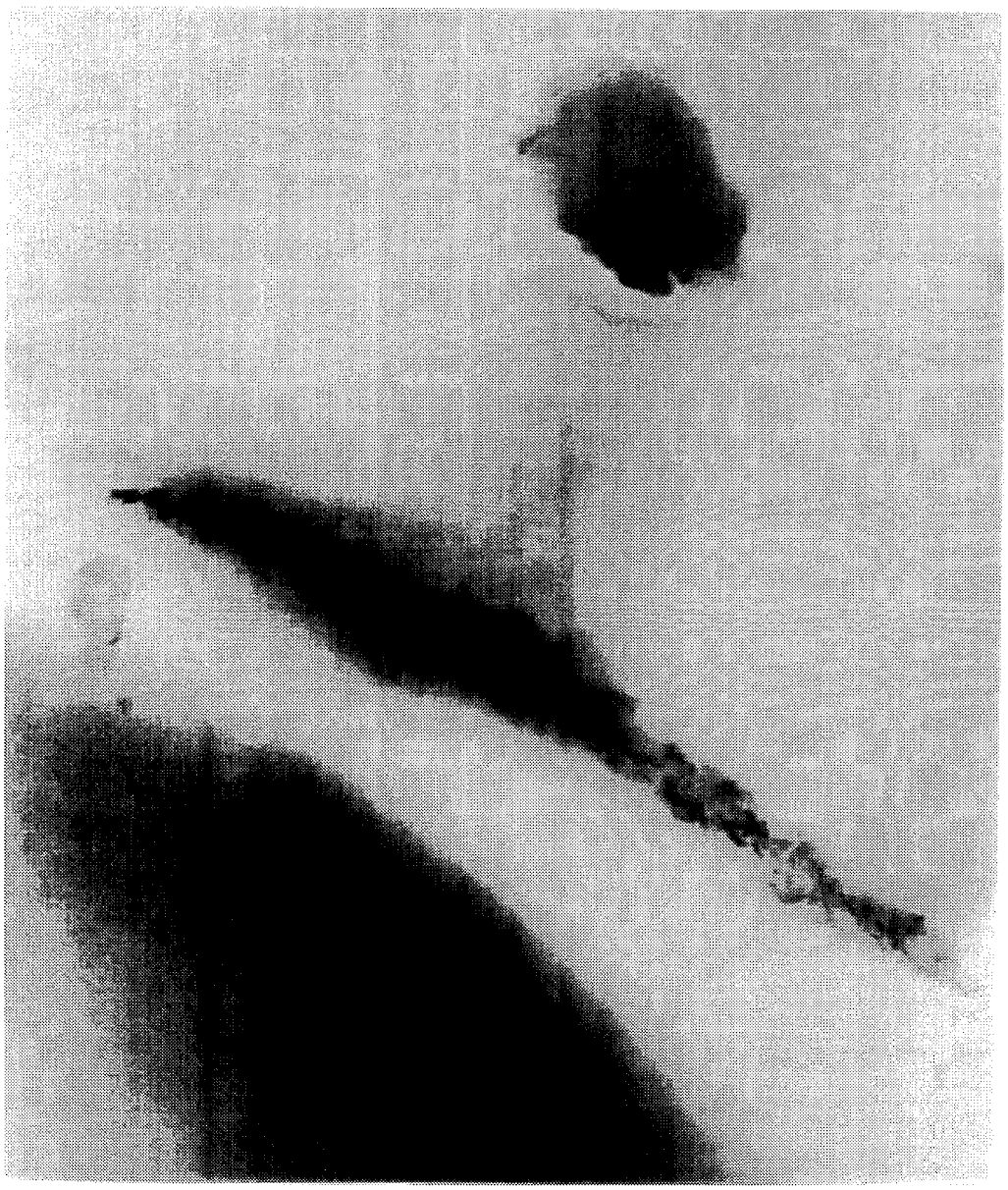
FIG. 13 is an enlarged photomicrograph of a portion of the exemplary elastomeric metallized fabric shown in FIG. 12.

FIG. 12 is a 7,500X transmission electron microphotograph of an aluminum coated elastomeric nonwoven web formed from an elastomeric KRATON® G block copolymer. FIG. 13 is a 30,000X transmission electron microphotograph of a portion of the material shown in FIG. 12. As shown in FIGS. 12 and 13, aluminum coating appears to be continuous and composed of 10 nanometer grains. Holes appear in certain sections of the material and are believed to be due to partial dissolution of the material in the embedment used to obtain the ultra thin cross sections.

EXAMPLES

The elastomeric metallized materials described in Examples A through D were made by depositing a metallic coating onto a commercially available elastomeric nonwoven fibrous web utilizing conventional metal deposition techniques. Various properties of the elastomeric metallized fabric and control materials were measured as described below.

The drape stiffness was determined using a stiffness tester available from Testing Machines, Amityville, Long Island, N.Y. 11701. Test results were obtained in accordance with ASTM standard test D1388-64 using the method described under Option A (Cantilever Test).

Cup crush test measurements were made to determine the flexibility of the elastomeric metallized fabric. The cup crush test evaluates fabric stiffness by measuring the peak load required for a 4.5 cm diameter hemispherically shaped foot to crush a 9"×9" piece of fabric shaped into an approximately 6.5 cm diameter by 6.5 cm tall inverted cup while the cup shaped fabric is surrounded by an approximately 6.5 cm diameter cylinder to maintain a uniform deformation of the cup shaped fabric. The foot and the cup are aligned to avoid contact between the cup walls and the foot which might affect the peak load. The peak load is measured while the foot descends at a rate of about 0.25 inches per second (15 inches per minute) utilizing a Model FTD-C-500 load cell (500 gram range) available from the Schaevitz company, Tennsauken, N.J.

The basis weight of each elastomeric metallized fabric sample was determined essentially in accordance with Method 5041 of Federal Test Method Standard No. 191A.

The air permeability or "porosity" of the elastomeric metallized fabric was determined utilizing a Frazier Air Permeability Tester available from the Frazier Precision Instrument Company. The Frazier porosity was measured in accordance with Federal Test Method 5450, Standard No. 191A, except that the sample size was 8"×8" instead of 7"×7".

Peak load, load at a specified elongation, peak total energy absorbed and peak elongation measurements of the elastomeric metallized fabric were made utilizing an Instron Model 1122 Universal Test Instrument essentially in accordance with Method 5100 of Federal Test Method Standard No. 191A. The sample gage length was set at 4 inches and the cross-head speed was set at 10 inches per minute.

Peak load refers to the maximum load or force encountered while elongating the sample to break. Load at a specified elongation is simply the load measured when a sample of the material is extended from the relaxed state to the specified elongation. Measurements of peak load and load at a specified elongation were made in the machine and cross-machine directions. The results are expressed in units of force (grams$_{force}$) for samples that measured 3 inches wide by 6 inches long.

Elongation refers to a ratio determined by measuring the difference between a nonwoven web's initial unextended length and its extended length in a particular dimension and dividing that difference by the nonwoven web's initial unextended length in that same dimension. This value is multiplied by 100 percent when elongation is expressed as a percent. The peak elongation is the elongation measured when the material has be stretched to about its peak load.

Peak total energy absorbed refers to the total area under a stress versus strain (i.e., load vs. elongation) curve up to the point of peak or maximum load. Total energy absorbed is expressed in units of work/(length)$^2$ such as, for example, (inch·lbs$_{force}$)/(inch)$^2$.

Example A

A sample of an elastomeric nonwoven web of polyetherester (Arnitel® EM400 available from DSM Engineering Plastics, North America, Inc., of Reading, Penna.) meltblown fibers identified as DEMIQUE® elastomeric nonwoven fabric available from the Kimberly-Clark Corporation was coated with aluminum metal utilizing a conventional small scale vacuum metallizing process. The DEMIQUE® elastomeric nonwoven fabric had a basis weight of about 51 grams per square meter and was in the form of a sample which measured approximately 10 mils thick (1 mil=0.001 inch) and approximately 7 inches×7 inches. This sample was placed in an NRC-3176 laboratory vacuum metallizer available from NRC Corp. of Newton, Mass. The sample was taped to the side of the vacuum chamber of the vacuum metallizer. The chamber containing the sample was pumped down to about $10^{-4}$ Torr (i.e., millimeters of Hg) and a current was applied to an aluminum wire to produce aluminum vapor in the vacuum chamber. The vapor condensed on the surface on the sample to produce a metallic coating. The amount of metal deposited on the sample (i.e., degree of deposition) was judged by placing a piece of a clear film (e.g., poly-vinyl chloride) over a sight glass port in the vacuum chamber and viewing the deposition on the clear film. The operation was stopped when enough metal covered the clear film so that the view through the sight glass port was obstructed. Generally speaking, the clear film was covered with metal during the deposition process in a relatively short time, on the order of minutes. Some samples were run on both sides by repeating this operation after turning the samples over. When the elastomeric metallized fabric was removed from the vacuum chamber, there was little or no flaking or loss of metal observable to the unaided eye during normal handling.

Example B

The procedure of Example A was repeated utilizing a pressure sensitive adhesive elastomeric nonwoven web of meltblown fibers formed from a blend including an A—B—A' elastomeric block copolymer. Specifically, the blend contained included, by weight, about 63 percent KRATON® G-1657, about 17 percent polyethylene NA 601, and about 20 percent REGALREZ® 1126. The blend was extruded utilizing conventional meltblowing techniques such as, for example, those described in U.S. Pat. No. 4,787,699. The elastomeric nonwoven web had a thickness of about 9.3 mils and a basis weight of about 70 gsm.

This elastomeric nonwoven web was metallized in accordance with the procedure of Example A. When the elastomeric metallized fabric was removed from the vacuum chamber, there was little or no flaking or loss of metal observable to the unaided eye during normal handling. Transmission electron microphotographs of this elastomeric metallized fabric were taken and are shown as FIGS. 12 and 13

Example C

An unstretched sample of DEMIQUE® elastomeric nonwoven web identical to that described in Example A was placed in a Denton Vacuum DV515 vapor deposition apparatus available from Denton Vacuum Corp. of Cherry Hill, N.J. The sample was taped to the side of the bell jar in the vacuum apparatus. The chamber was evacuated to a pressure of less than about $10^{-4}$ Torr (i.e., millimeters of Hg). A standard electrical current of about 5 amps was used to evaporate an aluminum wire to produce metal vapor inside the vacuum chamber. The procedure could be viewed through the bell jar and the process was stopped when visual inspection indicated an adequate metallic coating was deposited. The metallic coating was on only one side of the elastomeric fabric.

The same process was repeated for an identical sample of DEMIQUE® elastomeric fabric except that the elastomeric fabric was stretched approximately 100% and mounted on a frame to hold it in the stretched condition. In each case, when the elastomeric metallized fabrics were removed from the vacuum chamber, there was little or no flaking or loss of metal observable to the unaided eye during normal handling. Samples of both of these elastomeric metallized fabrics were examined by scanning electron microscopy. Scanning electron microphotographs of these materials are shown in FIGS. 2–9.

Example D

The procedure of Example A was conducted on a larger scale using a conventional commercial capacity vacuum metallizer. An example of suck equipment, which is capable of producing a vacuum of approximately $5\times10^{-4}$ Torr (i.e., millimeters of Hg) and thermally vaporizing a metal, is generally known and is depicted in FIG. 1. An elastomeric nonwoven web of meltblown polyetherester (Arnitel® EM400) fibers identified as DEMIQUE® elastomeric nonwoven fabric available from the Kimberly-Clark corporation was coated with aluminum metal utilizing a very large vacuum chamber with motorized wind and unwind rollers. The DEMIQUE® elastomeric nonwoven fabric had a basis weight of about 51 grams per square meter and measured approximately 10 mils thick (1 mil=0.001 inch) and approximately 45 inches in width. The elastomeric fabric was passed through the area containing the metal vapor at speeds which could make commercial operation feasible. One face of the elastomeric fabric contacted a water-cooled metal drum during the exposure to the metal vapor. Generally speaking, the DEMIQUE® nonwoven elastomeric fabric was exposed to the metal vapor for less than about 1 second. At much greater exposure times, the elastomeric fabric was deteriorated by the aluminum vapor. The elastomeric web handling equipment was configured to create a slight stretching of the elastomeric fabric (about 5 to 10%) as it passed though the metal vapor. When the elastomeric metallized fabric was removed from the vacuum chamber, there was little or no flaking or loss of metal observable to the unaided eye during normal handling. Transmission electron microphotographs of this elastomeric metallized fabric were taken and are shown as FIGS. 10 and 11.

The following properties were measured for the material of Example D that was metallized in the unstretched condition and for an un-metallized control sample of DEMIQUE® elastomeric nonwoven fabric: Peak Load, Peak Total Energy Absorbed, Frazier Porosity, Elongation, Basis Weight, Load at 25% elongation, Load at 40% elongation, Load at 200% elongation, and Load at 400% elongation. The results are identified for measurements taken in the machine direction (MD) and the cross-machine direction (CD) where appropriate. Results of these measurements are reported in Table 1.

TABLE 1

|  | Elastomeric Metallized Fabric | Elastomeric Control Fabric |
|---|---|---|
| Basis Weight (gsm) | 48.42 ± 2.64 | 50.83 ± 2.85 |
| Frazier Porosity (cfm/ft$^2$) | 425 | 407 |
| Cup Crush | | |
| Peak Load (grams$_{force}$) | 13 | 12 |
| Total Energy (grams$_{force}$/mm) | 202 | 187 |
| Peak Total Energy Absorbed (inch-lbs/in.$^2$) | | |
| (MD) | 5.45 | 5.52 |
| (CD) | 3.62 | 3.79 |
| Peak Load, grams$_{force}$ | | |
| (MD) | 2.22 | 2.28 |
| (CD) | 1.47 | 1.57 |
| Peak Elongation, (inches) (percent) | | |
| (MD) | 19.92 (842%) | 19.93 (847%) |
| (CD) | 19.36 (766%) | 19.37 (767%) |
| Load @ 25% Elongation (grams$_{force}$) | | |
| (MD) | 620 | 583 |
| (CD) | 389 | 392 |
| Load @ 50% Elongation (grams$_{force}$) | | |
| (MD) | 888 | 873 |
| (CD) | 574 | 587 |
| Load @ 200% Elong. (grams$_{force}$) | | |
| (MD) | 1400 | 1415 |
| (CD) | 994 | 1034 |
| Load @ 400% Elong. (grams$_{force}$) | | |
| (MD) | 1942 | 1973 |
| (CD) | 1340 | 1417 |
| Bending Length (CM) | 3.10 | 2.90 |
| Drape Stiffness | 1.55 | 1.45 |

The elastomeric metallized fabric was also tested to measure the amount of material (e.g., metal flakes and particles as well as fibrous materials) shed during normal handling. Materials were evaluated using a Climet Lint test conducted in accordance with INDA Standard Test 160.0-83 with the following modifications: (1) the sample size was 6 inch by 6 inch instead of 7 inch by 8 inch; and (2) the test was run for 36 seconds instead of 6 minutes. It should be noted that test results of less than about 100 at a particle size of about 0.5μ are considered to be within the experimental error of the test procedure. Results are reported for other types of commercially available fibrous webs for purposes of comparison. As shown in Table 2 there was little detectable flaking or detachment of the metallic coating and/or fibrous material from the elastomeric metallized fabric of the present invention. These results are believed to show that the metallic coating adheres to the elastomeric fabric. Additionally, the low level of particles detected by the test indicates the elastomeric metallized fabric may have properties that are highly desirable for applications such as, for example, clean-rooms, surgical procedures, laboratories and the like.

TABLE 2

CLIMET LINT TEST

| Fabric | 0.5μ Particles | 10μ Particles |
|---|---|---|
| Demique ® Polyetherester Meltblown Web | 32 | 4 |
| Metallized Demique ® Polyetherester Meltblown Web | 72 | 6 |
| (Chicopee Mfg. Co.)[1] Workwell ® 8487 | 2,063 | 154 |
| (Chicopee Mfg. Co.)[1] Solvent Wipe ® 8700 | 1,187 | 2 |
| (Fort Howard Paper Co.)[2] Wipe Away ® | 119,628 | 3,263 |
| (IFC)[3] Like Rags ® 1100 | 7,449 | 127 |
| (James River Paper Co.)[4] Clothmaster ® 824 | 2,183 | 139 |
| (James River Paper Co.)[4] Maratuff ® 860W | 36,169 | 377 |
| (K-C)[5] Kimtex ® | 2,564 | 100 |
| (K-C)[5] Crew ® 33330 | 1,993 | 42 |
| (K-C)[5] Kimwipes ® 34133 | 37,603 | 2,055 |
| (K-C)[5] Kimwipes ® EXL | 31,168 | 2,240 |
| (K-C)[5] Kaydry ® 34721 | 10,121 | 1,635 |
| (K-C)[5] Teri ® 34785 | 21,160 | 3,679 |
| (K-C)[5] Teri ® Plus 34800 | 14,178 | 730 |
| (K-C)[5] Kimtowels ® 47000 | 106,014 | 46,403 |
| (Scott Paper Co.)[6] Wypall ® 5700 | 22,858 | 1,819 |

[1]Chicopee Manufacturing Co. (Subs. of Johnson & Johnson), Milltown, New Jersey
[2]Fort Howard Paper Co., Green Bay, Wisconsin
[3]IFC Nonwovens Inc., Jackson, Tennessee
[4]James River Paper Co., Richmond, Virginia
[5]Kimberly-Clark Corporation, Neenah, Wisconsin
[6]Scott Paper Co., Philadelphia, Pennsylvania Thermal conductivity of the elastomeric metallized fabric was measured using modified Kawabata Thermolabo equipment which included the small 5 cm×5 cm (25 cm$^2$) guarded hot plate as a heat source and a water cooled bath as a heat sink. The elastomeric metallized fabric sample was held between the heat source and heat sink under a load of about 6 grams$_{force}$/cm$^2$. A temperature difference of about 10° C. was maintained between the hot plate and the heat sink.

The hot plate and the guard each contained sensors that reported temperature and the water bath (heat sink) temperature was measured utilizing a microthermocouple. When the system (hot plate, guard, sample and heat sink) was at steady state, the power input (W) to the hot plate was measured and thermal conductance (k) was calculated as heat flow per temperature difference per unit area. Overall thermal conductivity (K) was calculated as the product of the thermal conductance and fabric thickness (i.e., Conductivity=Conductance×Thickness).

Thermal resistance and the permeability index of the elastomeric metallized fabric was measured utilizing a thermal analyzing system composed of two parts: 1) an environmental control chamber which was maintained at a standard condition: 21 degrees Centigrade, 65% Relative Humidity; and 2) a component to stimulate the skin/body.

The environmental control chamber was a Tabai ESPEC's Platinous Lucifer Model PL-2G, programmable controlled temperature and humidity chamber. This chamber housed a sub-chamber made from Lucite plastic that provided precise control of air velocity. A skin simulating guarded hot plate, or sweating hot plate, was positioned inside the sub-chamber. Air currents impinged vertically on the surface of the guarded hot plate at a rate of about 20 cm/sec.

Simultaneous heat and moisture transfer was measured using a sweating hot plate. This sweating hot plate featured four simulated sweating glands that supplied water to the heated surface at the rate of 0.077 ml/min per gland. The water flow was controlled using an Ismatec cartridge peristaltic pump while the surface of the hot plate was covered by a highly wettable and dimensionally stable polyester/rayon-spunlace nonwoven membrane to allow water to easily spread over the surface. Three simulated skin models were used: (1) a standard dry model; (2) a dry-spaced model; and (3) a standard wet model. For the standard dry model, a guarded hot plate was used as a heat source and the specimen was placed directly on it. In the dry-spaced model, the set-up was the same as for the standard dry model except that a 4.5 mm spacer was used between the plate surface and sample to prevent contact and incorporate an air layer. For the standard wet model, the sweating hot plate was used instead of the guarded hot plate.

The amount of heat and rate of heat flow through a specimen during testing was measured utilizing a box containing a thin copper heat capacitor fitted with a temperature sensing device. These components were placed between the heat source (i.e., the hot plate) and the specimen to detect the rate at which heat was pulled from a finite thermal capacity (e.g., simulated skin) through a fabric.

The Dry Heat Transfer rate was measured and reported in units of Watts/$M^2 \cdot °C$. Thermal resistance was calculated from the Dry Heat Transfer rate measured from the standard dry model utilizing the following equation:

*Thermal Resistance=(1/Dry Heat Transfer Rate)/0.155*

Thermal resistance is reported in units of clo. The clo is a unit of thermal resistance defined as the amount of thermal resistance provided by an arbitrarily selected standard set of clothing. It may be expressed by the following equation:

1 $clo=(0.18° C.) (meter)^2(hour))/(kilocalories)$

The highest clo value represents the lowest heat flow through the material and is predicted to be the better insulator. For the purpose of comparison, values for thermal resistance was calculated from the reported Wet Heat Transfer rate.

The Permeability Index ($I_m$) of the sample was calculated from the measured Dry Heat Transfer rate and Wet Heat Transfer rate. The permeability index is defined as the ratio of the thermal and evaporative resistance of the fabric to the ratio of thermal and evaporative resistance of air. This ratio (i.e., the permeability index) may have a value that is between 0 and 1 and is a prediction of how readily moisture vapor and heat pass from the body through a material to help maintain body comfort. A higher index value is generally equated with better comfort. The permeability index may be calculated using the following formula:

$I_m=0.0607 (E/H) (Ts-Ta) / (Ps-Pa)$ where, $E$=heat transfer rate (W/$m^2 \cdot °C\Delta T$) due to moisture evaporation, (Wet Heat Transfer–Dry Heat Transfer)

$H$=heat transfer rate (W/$M^2 \cdot °C\Delta T$) due to heat (Dry Heat Transfer)

$Ps(T)=\exp (16.6536-4030.183/(T+235))$ $Pa(T)=(RH/100)Ps (T)$ Ts and Ta are the temperature on the skin surface and the ambient environment, respectively, and RH is the relative humidity.

Ts=35° C., Ta=21° C. RH=65%

Ps and Pa are water vapor pressures (kPa) on skin surface and in ambient environment, respectively.

The results of tests conducted on an elastomeric metallized fabric prepared in accordance with Example D are reported in Tables 3 and 4. Table 5 lists results for an elastomeric metallized fabric of the present invention as well as other types of nonwoven fibrous webs for purposes of comparison.

TABLE 3

| \Condition Reps\ | Dry W | (Watts) W/$m^2 \cdot °C$. | Wet W | (Watts) W/$m^2 \cdot °C$. | Clo | i |
|---|---|---|---|---|---|---|
| METALLIC SIDE | | | | | | |
| −1 | 2.55 | | 7.38 | | | |
| −2 | 2.58 | | 7.94 | | | |
| −3 | 2.61 | | 7.70 | | | |
| Avg. | 2.58 | 18.43 | 7.67 | 54.79 | 0.350 | 0.639 |
| REVERSE SIDE | | | | | | |
| −1 | 2.19 | | | | | |
| −2 | 2.11 | | | | | |
| −3 | 2.25 | | | | | |
| Avg. | 2.18 | 15.57 | | | 0.414 | |

T (Air Temp) = 21°,
BT (Plate Temp) = 35° C.,
65% Relative Humidity

TABLE 4

HEAT TRANSFER COMPARISON OF TESTS

| METALLIC SIDE | STANDARD DRY TEST | DRY-SPACE TEST |
|---|---|---|
| Watts | 2.58 | 1.16 |
| W/$m^2$ °C. | 18.43 | 8.20 |
| Clo | 0.350 | 0.780 |

*Same procedure as standard dry test with a 4.5 mm spacer used between plate surface and sample to prevent contact and incorporate an air layer.

TABLE 5

| | Heat Transfer | | Clo | $I_m$ |
|---|---|---|---|---|
| | Dry W/$m^2$ °C. | Wet W/$m^2$ °C. | — | — |
| Metallized Demique ® elastomeric nonwoven web[1] Basis weight = 51 gsm | 18.43 | 54.79 | 0.350 | 0.639 |
| SMS[2] laminate Basis weight = 41 gsm | 16.07 | 75.89 | 0.401 | 0.428 |
| SMS[2] laminate Basis weight = 58 gsm | 17.14 | 76.96 | 0.376 | 0.401 |
| Tyvek ®[3] | 17.50 | 36.79 | 0.369 | 0.127 |

TABLE 5-continued

| | Heat Transfer | | | |
|---|---|---|---|---|
| | Dry W/m² °C. | Wet W/m² °C. | Clo | $I_m$ |
| Basis weight = 41 gsm Polyester/cotton woven textile fabric Basis weight = 40 gsm | 18.57 | 71.61 | 0.347 | 0.328 |

1 = meltblown polyetherester fibers (Arnitel ® EM400)
2 = laminate of spunbond/meltblown/spunbond polyolefinic nonwoven webs
3 = polyolefinic nonwoven material available from E. I. Du Pont de Nemours & Company.

As can be seen from Table 5, an elastomeric metallized fabric of the present invention has dry and wet heat transfer and insulation (i.e., clo) values that correspond to other types of woven and nonwoven fabrics while also providing a much greater permeability index thereby permitting larger amounts of moisture vapor to pass through the fabric to provide increased body comfort.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

RELATED APPLICATIONS

This patent application is one of a group of commonly assigned patent applications which are being filed on the same date. The group includes the present application and application Ser. No. 08/447,473 entitled "An Elastic Metallized Film and Process to Make the Same" in the name of Bernard Cohen. The subject matter of that application is hereby incorporated by reference.

What is claimed is:

1. A process of making an elastomeric metallized nonwoven fabric comprising:

providing a nonwoven web of elastomeric meltblown fibers; and metallizing at least one portion of at least one side of the nonwoven web of elastomeric meltblown fibers by metal vapor deposition or metal sputtering; and cooling the nonwoven web of elastomeric meltblown fibers during metallization so that said portion of the nonwoven web is substantially covered with a metallic coating.

2. The process of claim 1 further including the step of pre-treating the surface of individual fibers of the elastomeric nonwoven fabric before the elastomeric fabric is metallized.

3. The process of claim 1 further including the step of elongating the elastomeric nonwoven fabric and maintaining it in an elongated condition during the metallizing step.

4. The process of claim 3 wherein the elastomeric nonwoven fabric is elongated at least about 10 percent.

5. The process of claim 4 wherein the elastomeric nonwoven fabric is elongated from about 15 percent to about 500 percent.

6. A process of making an elastomeric metallized nonwoven fabric comprising:

providing a nonwoven web of elastomeric meltblown fibers;

elongating the nonwoven web of elastomeric meltblown fibers and maintaining it in an elongated condition;

metallizing at least one portion of at least one side of the nonwoven web of elastomeric meltblown fibers by metal vapor deposition or metal sputtering;

cooling the nonwoven web of elastomeric meltblown fibers during metallization so that said portion of the nonwoven web is substantially covered with a metallic coating and so that upon application of a stretching force, the elastomeric metallized nonwoven fabric is adapted to elongate to at least about 125 percent of its relaxed length and recover at least 40 percent of its elongation upon release of the stretching force.

7. The process of claim 6 further including the step of pre-treating the surface of individual fibers of the elastomeric nonwoven fabric before the elastomeric fabric is metallized.

8. The process of claim 6 wherein the elastomeric nonwoven fabric is elongated at least about 10 percent.

9. The process of claim 6 wherein the elastomeric nonwoven fabric is elongated from about 15 percent to about 500 percent.

10. A process of making an elastomeric metallized nonwoven fabric comprising:

providing a nonwoven web of elastomeric meltblown fibers;

metallizing at least one portion of at least one side of the nonwoven web of elastomeric meltblown fibers by metal vapor deposition or metal sputtering; and cooling the nonwoven web of elastomeric meltblown fibers during metallization so that said portion of the nonwoven web is substantially covered with a metallic coating and so that upon application of a stretching force, the elastomeric metallized nonwoven fabric is adapted to elongate to at least about 125 percent of its relaxed length and recover at least 40 percent of its elongation upon release of the stretching force.

\* \* \* \* \*